United States Patent [19]

Marancik et al.

[11] Patent Number: 4,857,675
[45] Date of Patent: Aug. 15, 1989

[54] FORCED FLOW SUPERCONDUCTING CABLE AND METHOD OF MANUFACTURE

[75] Inventors: William G. Marancik, Plainfield; Seungok Hong, New Providence; Glenn W. Grabinsky, Montville, all of N.J.

[73] Assignee: Oxford Superconducting Technology, Carteret, N.J.

[21] Appl. No.: 55,520

[22] Filed: May 28, 1987

[51] Int. Cl.[4] .......................................... H01B 12/16
[52] U.S. Cl. .................................... 174/15.4; 29/599; 174/125.1
[58] Field of Search ................ 174/155, 126 S, 128 S, 174/125.1; 29/599

[56] References Cited

U.S. PATENT DOCUMENTS

| | | | |
|---|---|---|---|
| 3,474,187 | 10/1969 | Donadieu et al. | 174/128 S |
| 3,699,647 | 10/1972 | Bidault et al. | 174/128 S X |
| 4,195,199 | 3/1980 | Hillmann et al. | 174/128 S |
| 4,395,584 | 7/1983 | Ries | 174/128 S X |
| 4,411,712 | 10/1983 | Marancik | 29/599 X |
| 4,454,380 | 6/1984 | Turowski | 174/15 S X |
| 4,646,428 | 3/1987 | Marancik et al. | 29/599 |

OTHER PUBLICATIONS

Onishi, T. et al.; Fabrication of Cryostable, Low Loss Cable for a 3.8 M J Pulsed Superconducting Coil; Conference: 9th Symposium on Engineering Problems of Fusion Research, Chicago, IL; 26–29, Oct. 1981.

"High Current Superconductors for Tokamak Toroidal Field Coil" by W. A. Feitz.
Progress Report of May 1978 entitled "Force Cooled Superconductor Development at the Francis Bitter National Magnet Laboratory at MIT" by M. O. Hoenig.
"Supercritical Helium Cooled, Cabled, Superconducting Hollow Conductors for Large High Field Magnets" by M. O. Hoenig.
"Stability Measurements of a Large $Nb_3Sn$ Force-Cooled Conductor" by J. R. Miller.
"Niobium-3-Tin Internally Cooled Cabled Superconductor (ICCS) Technology I" by M. O. Hoenig et al.
Progress Report of Dec. 15, 1976, on "Experimental Evaluation of Forced Flow Cooled Superconductors" of Francis Bitter National Magnet Laboratory at MIT.

*Primary Examiner*—Morris H. Nimmo
*Attorney, Agent, or Firm*—Klauber & Jackson

[57] ABSTRACT

A superconductor of the cable-in-conduit type which employs forced flow of liquid helium, comprises a flat-sided housing having an essentially rectangular cross-section, within the housing a metal support bar cabled with multifilamentary superconducting subcables alternated with stainless steel cables or wires. The superconductor provides a large heat transfer surface owing to the multifilamentary superconducting subcables which have a void volume in the range of about 30–35%, as well as mechanical support owing to the stainless steel cables or wires.

15 Claims, 3 Drawing Sheets

FORCED FLOW SUPERCONDUCTING CABLE AND METHOD OF MANUFACTURE

FIELD OF THE INVENTION

This invention relates to a superconductor of the cable-in-conduit type which is adapted to be used with forced flow of a cooling fluid, in particular liquid helium, and to a method of manufacture thereof. The invention has application to large magnet systems and in particular as a toroidal field coil conductor.

BACKGROUND OF THE INVENTION

The phenomenon of superconductivity, that is, zero electrical resistance, possessed by many metals at near absolute zero temperatures, has received steadily increasing attention in recent years due to the development of materials which exhibit this property at sufficiently high temperatures, while carrying relatively high currents in the presence of sufficiently great magnetic fields as to be of commercial utility. Among the more useful of the superconducting materials developed to date are the intermetallic compounds $Nb_3Sn$ and $V_3Ga$. These materials have sufficiently good superconductive properties as to render them attractive in the development of useful electrical machinery.

Recently developed processes for the manufacture of $Nb_3Sn$ have generally involved the so-called "bronze process" in which rods or wires of Nb are dispersed throughout a matrix consisting of a CuSn bronze. The assembly is worked to a desired final size and heat treated, at which time $Nb_3Sn$ is formed at the interfaces between the Nb rods and the bronze matrix by diffusion of the Sn from the bronze. See, for example, U.S. Pat. No. 3,918,998. Refinements of the bronze process include providing a quantity of good electrical conductor such as pure Cu in close proximity to the $Nb_3Sn$ filaments and isolating this pure Cu from diffusion of Sn which would destroy the high electrical conductivity of pure Cu, by interposing a layer of material impermeable to Sn therebetween such as, for example, Ta; see, e.g. U.S. Pat. No. 4,205,199. The same process is used to form multifilamentary $V_3Ga$; V rods are disposed in a CuGa bronze matrix.

A quantity of a good electrical conductor in close proximity to the superconductor material is useful as an alternate current path or shunt in situations where it is likely that some fraction of the superconductive filaments will return to the normally-conducting state, which can happen, for example, in a rapidly-varying magnetic field. As discussed in a Progress Report of Dec. 15, 1976 on "Experimental Evaluation of Forced Flow Cooled Superconductors" of the Francis Bitter National Magnet Laboratory at MIT, a cryostabilized superconductor must inherently include a stabilizer. In the case of a forced flow cooled conductor the stabilizer must carry the total current while the superconductor is above its critical temperature. The stabilizer must further carry any current that the superconductor cannot handle during the current-sharing phase of recovery. The bronze process may be used to achieve multifilamentary intermetallic superconductors which are stabilized by the provision of a quantity of a good electrical conductor. However, other methods which do not employ the bronze process may also be used to fabricate multifilament superconducting elements, see Marancik U.S. Pat. Nos. 4,646,428 and 4,411,712, both incorporated herein by reference. The brittle nature of the intermetallic compounds $Nb_3Sn$ and $V_3Ga$ and the difficulty of bending them, especially when there is a sharp curvature, have been noted in these patents. As described in Marancik et al U.S. Pat. No. 4,646,428, the centers of a plurality of copper tubes are filled with tin and drawn to form Cu-Sn wires which are cabled around a core Nb wire; a plurality of these strands are provided in a copper tube, or a copper foil or finely wound copper wire; and a plurality of said tubes are packed into a copper can to form a billet which is drawn to produce a multifilament wire; and heat treatment is applied to cause the tin to diffuse and form the intermetallic $Nb_3Sn$ at the surface of the Nb filaments to produce the ultimate superconducting wire product.

As aforesaid, the principal application of such superconducting materials is in magnets. In connection with this use, they must be wound upon a toroidal structure, preferably a D-shaped structure, as discussed in a paper by W. A. Fietz entitled "High Current Superconductors for Tokamak Toxoidal Field Coil" presented at the Applied Superconductivity Conference at Stanford, Calif., Aug. 17-20, 1976, and as discussed and illustrated in a Progress Report of May 1978 on "Force-Cooled Superconductor Development at the Francis Bitter National Magnet Laboratory at MIT." However, since the intermetallic compounds such as $Nb_3Sn$ are very brittle, winding them onto a D-shaped coil whereby relatively sharp turns are imposed, presents some difficulty. One approach to this problem is to use a cable as flat as possible, generally referred to as a "Rutherford type" cable. However, the latter presents a further difficulty in that it has an insufficient void volume to permit adequate flow of the coolant. It is typically 97% dense with very few voids and cannot be cooled by forced flow of coolant through the conductor itself but only by a surrounding bath.

In more detail, a Rutherford cable is composed of two flat layers only. Each wire occupies a fixed position relative to all other wires in the cable such that no wire crosses over any other wire. The normal method of manufacturing can serve to describe the cable. The wires which form the cable are first formed into a series of spirals, generally on a mandrel. As the wires are slid off the mandrel they form first an oval then a flat rectangular cross-section. This is then further flattened to give some mechanical strength.

As commented on in the paper of W. A. Fietz, the conductor must be capable of withstanding mechanical stresses of three types without adverse effects on device performance. The first of these stresses occurs during the winding and handling of the conductor, presumably at room temperature. The conductor is subjected to bending, twisting tensile, and compressive forces between the time of its manufacture and the completion of winding of the device. A second critical stress period for the conductor may occur during cooldown of the device. Finally, the conductor must be designed to withstand the stresses of operating the energized device under any conceivable conditions, including quench. Although the stabilized conductor makes the possibility of quench remote, an event such as loss of coolant might result in a quench which the conductor must withstand without damage.

With regard to the function of the coolant, a paper by M. O. Hoenig et al on "Supercritical Helium Cooled, Cabled, Superconducting Hollow Conductors For Large High Field Magnets" presented at the 6th International Cryogenic Engineering Conference at Grenoble, France in 1976 stated that under steadystate conditions a DC current, carried by the superconducting filaments imbedded in the copper strands will generate no heating. Except to intercept external heating, the coolant is only needed to remove heat imposed by a transient instability. Since eddy currents can be virtually elminated by the transposition and twisting of conductor strands, the unscheduled instability will most likely come from wire motion. The imposition of such an instability results in the release of heat in the conductor. Due to its extremely low heat capacity the conductor temperature will rapidly rise, normalizing the superconductor and transferring current to its copper matrix. The system can be considered cryostable if the total current carried can be returned to the superconductor within a reasonable recovery period. Since the duration of the period is limited by the heat capacity of the coolant, cryostability becomes a function of coolant mass flow, permissible temperature rise and an adequate heat transfer coefficient.

Also of interest is a paper entitled "Stability Measurements of a Large $Nb_3Sn$ Force-Cooled Conductor" (undated) by J. R. Miller et al of the Oak Ridge National Laboratory.

Thus objects of the invention are to attain high heat transfer from $Nb_3Sn$ elements to the cooling fluid and a high inventory of cooling fluid within the conduit. Further objects are to provide mechanical support for the $Nb_3Sn$ elements and protect them from damage due to mechanical stresses such as compaction, bending and the like.

SUMMARY OF THE INVENTION

According to the invention, a method of manufacturing a forced flow type superconducting cable-in-conduit comprises the following steps:

(a) providing multifilamentary superconducting subcables (SSC's);

(b) cabling around a first tube, SSC's from step (a) alternately with stainless steel cable or wire;

(c) forming a second tube around the composite formed from step (b); and (d) flattening the double tube composite from step (c) to form a cable in a jacket.

In this context the term "forced flow type" refers to the mode of cooling and means that the coolant is continuously pumped internally through the conduit as contrasted with employing an outside cooling liquid bath.

The SSC's can be purchased from Oxford Superconducting Technology, 600 Milik Street, P.O. Box 429, Carteret, N.J. 07008-0429. The stainless steel cables can be purchased from McMaster-Carr Supply Co., P.O. Box 440, New Brunswick, N.J. or would be made by Oxford Superconducting Technology from stainless wire. A full description of cables including stainless steel can be found in the publication "Leschen Wire Rope", Leschen Wire Rope Division, H.K. Porter Co., Inc., 1956.

The method results in a structure of the desired type which comprises a housing in the form of a flat-sided figure having an essentially rectangular cross-section, within said housing a metal support bar or strip extending longitudinally and substantially centrally thereof, cabled around said support bar an array of multifilamentary SSC's alternated with stainless steel cables or wires, said structure having interior passages for the flow of a cooling fluid, suitably liquid helium under supercritical pressure. It should be noted that the void volume of the conduit comprises not only the void between subcables in the conduit but also the void within each subcable since the coolant flows within each subcable as well. Preferably the superconducting subcables have a void volume in the range of about 30 to 35% by virture of their multifilamentary nature and method of preparation, thus providing a large heat transfer surface. On the other hand the stainless steel cables or wires are more dense than the superconductor portions, so that they take the load. Preferably the superconducting subcables are used in a ratio to the stainless steel cables or wires within the range of 3:1 to 1:1 depending on tube wall thickness and geometry.

The jacket or conduit is preferably made from a precipitation - hardened steel, commercially available as JBK-75 or a nickel-cobalt alloy, sold as Incoloy 905M to minimize strain degradatin in the $Nb_3Sn$ during post reaction cooldown. As discussed in a paper by M. O. Hoenig et al on "Niobium-3-Tin Internally Cooled Cables Superconductor (ICCS) Technology I" presented in Grenoble, France in 1983, in general, current density is a function of strain. Metals or alloys with a coefficient of thermal expansion not above that of the superconductor result in an essentially strain-free superconductor, hence the effect of cable compaction on current density is minimal. Consequently metals or alloys having a low coefficient of thermal expansion, viz., either lower than, closely matching, or not substantially above that of the superconductor, are useful.

The internally cooled, cabled superconductor of this invention may be manufactured as a separate, self-contained unit through which a coolant, e.g., liquid helium, is forced when in use. It is adapted to be wound around the outside of a doughnut-shaped or modified ring-shaped structure, preferably a D-ring shape. In connection with its use to form magnets, an iron or steel bar extends through the interior open space of the ring and becomes magnetized when the ends of the superconductor wires are connected to a source of current. The essentially rectangular, flattened structure is well adapted to be placed around the ring to form the final toroidal magnetic field coil conductor since it can tolerate the required bend radius.

Thus the basic idea of this invention is to employ an internally cooled, cabled superconductor in a Rutherford flat-sided configuration, which is further characterized by its large heat transfer surface and helium inventory for enthalpy stabilization.

BRIEF DESCRIPTION OF THE DRAWINGS

The invention will be described with reference to the drawings in which.

DETAILED DESCRIPTION

Superconducting subcables are provided, each of which comprises a plurality of strands, for example 27 or 45 wires or strands, each wire or strand in turn being composed of several thousand filaments, e.g., about 3,000. Such SSC's are known in the art, for example from the above-mentioned Marancik patents. It follows that these multifilamentary superconducting subcables have numerous interstices or passages for the flow of liquid helium and present a high surface area, thus a high heat transfer surface, to the latter. The helium is in direct contact with the high surface area multifilamentary superconducting subcables.

A detailed description of the invention is given in the following example, which is intended to be illustrative and not limitative.

Example

Figure 1:
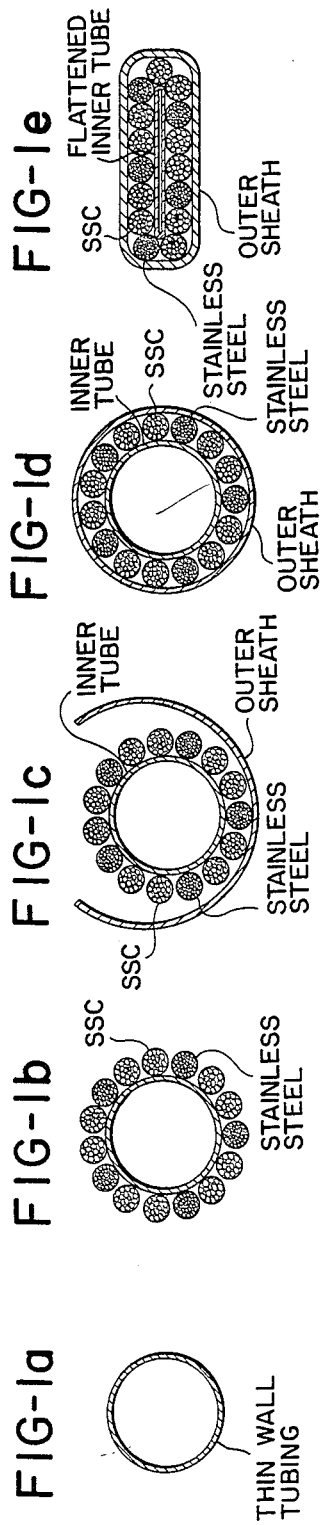
FIGS. 1a to 1e illustrate the method of manufacture and show a cross-section of the conductor at successive stages of preparation.

The technique of fabrication can be understood by reference to FIGS. 1a to 1e. The production line consists of a cabling machine, tube mill, turkshead and a take up reel. All of these devices are conventional apparatus well-known in the metal fabrication art. Thin wall tubing of e.g. Incoloy 905M, as shown in FIG. 1a is led through the cabling machine where, for example, 14 superconducting subcables and 7 stainless steel cables are wrapped, i.e., intercabled or woven, around the inner tube. See FIG. 1b. This configuration is continuously fed into the tube mill where a sheath of, e.g., Incoloy 905M is formed around the cables, per FIG. 1c. The surrounding piece is welded closed, see FIG. 1d. A gap of about 1.5 mm is maintained between the sheathing and cable to prevent any damage to the inner cable as well as to ensure uniform welding conditions. The round conduit is then reduced in diameter to obtain intimate contact with the inner cables and to slightly reduce the entire composite. The initial formation of the rectangle also takes place in the mill reduction section. The sheathed configuration is then brought into the final dimensions in a turkshead, as illustrated in FIG. 1e. This device is essentially a four roller die used to produce rectangular cross-sectioned products by die action.

Figure 2:
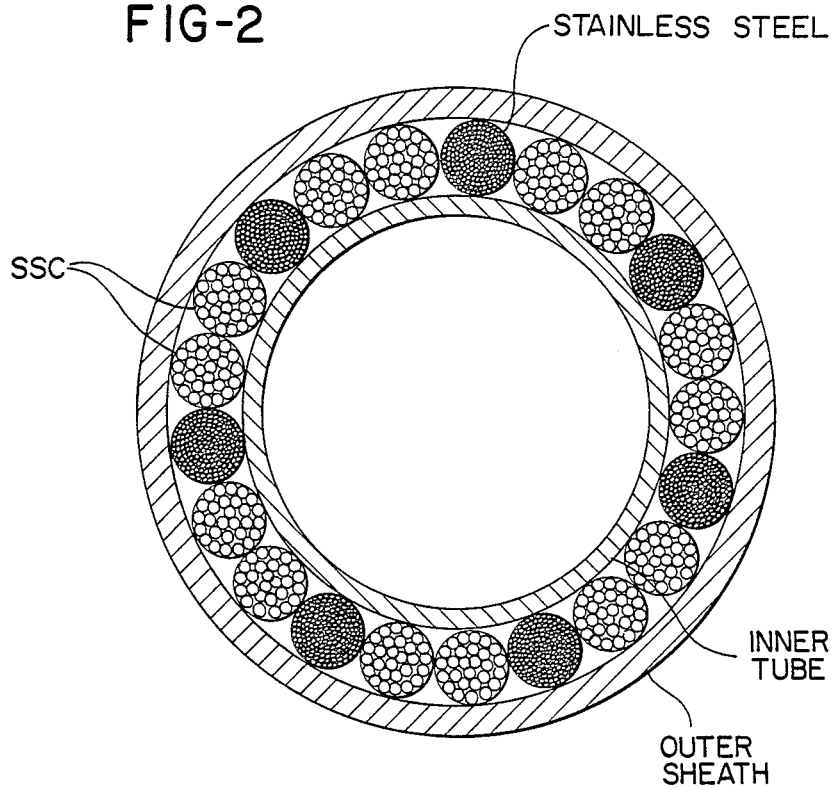
FIG. 2 is a schematic diagram of the cross-section of the conductor, at an intermediate stage of manufacture, with 14 superconducting and 7 stainless steel cables for strength and support.
Figure 3:
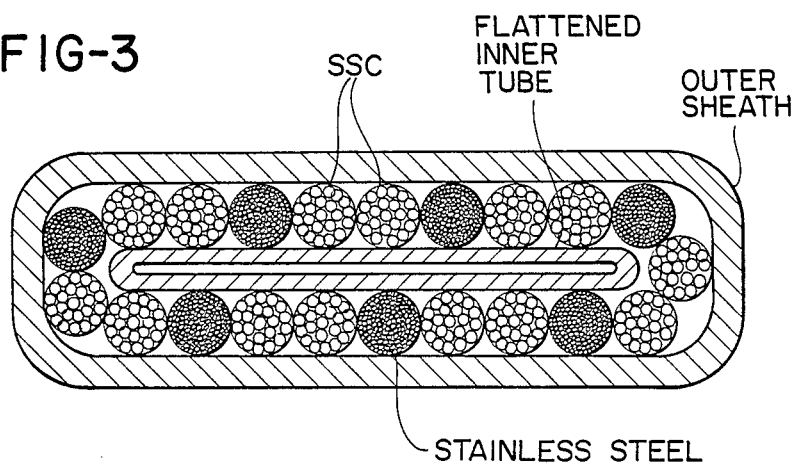
FIG. 3 is a schematic diagram of the cross-section of the final configuration of the product, wherein it can be seen that the cross-section is essentially rectangular, the three-dimensional structure being substantially a parallelepiped, in particular a rectangular parallelepiped.

FIG. 2 shows the intermediate configuration and FIG. 3 the final configuration of the superconducting cable-in-conduit. It may be noted that in the final configuration shown in FIG. 3, the cross-sectional shapes of the subcables are somewhat schematic; in reality they may be flattened somewhat by the compaction step. The inner tube essentially becomes a single strip without an opening, by the compaction. The SSC's and stainless steel cables alternate, e.g. one or more than one SSC alternates with a single stainless steel cable, see FIG. 3.

The compacted stainless cables perform two functions. During manufacture the composite is deformed from round to rectangular. Since the steel cables are more dense than the superconductor cables, the load is taken by the stainless maintaining the desired void fraction in and around the superconducting cables. The diameter of the stainless is selected so as to obtain an appropriate spacing between the superconductor portions. Without the stainless cables, conversion of the composite to its final shape would result in unpredictable compaction of and possible damage to the superconductor. During coil operation, the stainless absorbs some of the Lorentz forces developed in the adjacent superconductor. Supercritical He is pumped in the jacket providing intimate contact for heat transfer. The superconductor cables contain about 32% void fraction while the stainless cables are of higher density. The conductor conduit is low coefficient of thermal expansion Incoloy 905M which will minimize strain degradation in the $Nb_3Sn$ during the post reaction cooldown, or an alloy such as JBK-75. It can be seen that the invention provides means to prevent the superconductor subcables from compacting to an undesirable extent, and provides high void space.

Figure 4:
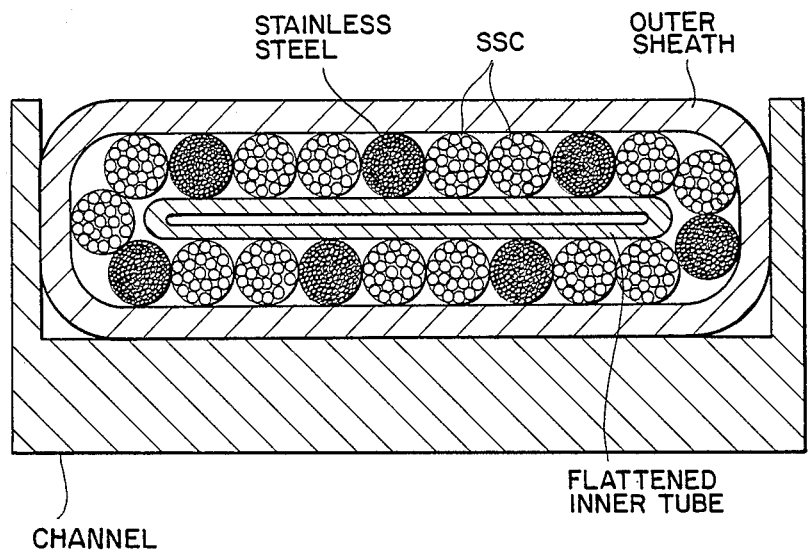
FIG. 4 is a schematic diagram of the cross-section of a cable-in-conduit superconductor in a channel for additional support.

It is also advantageous to add a further piece of metal suitably of the alloys mentioned above for the conduit, to improve the mechanical characteristics. As shown in FIG. 4, this may comprise a channel in which the cable-in-conduit is placed.

Although the invention has been described with reference particularly to $Nb_3Sn$ as the superconducting compound, it will be evident that it has applicability to other superconducting materials which are brittle in nature, including recently discovered ceramic materials.

What is claimed is:

1. A method of manufacturing a forced flow type supeconducting cable-in-conduit which comprises the following steps:
   (a) providing multifilamentary superconducting subcables (SSC's) having void spaces within;
   (b) cabling around a first tube, SSC's from step (a) while alternately cabling stainless steel cable or wire between SSC's;
   (c) forming a second tube around the composite formed from step (b); and
   (d) flattening the double tube composite from step (c) to form a cable-in-conduit.

2. A method as set forth in claim 1 in which the material of said first and second tubes is a precipitation-hardened steel or a nickel-cobalt alloy.

3. A method as set forth in claim 1 in which the material of the SSC's comprises $Nb_3Sn$ stabilized with Cu.

4. A method as set forth in claim 1 in which the ratio of the number of SSC's to stainless steel cables or wires is within the range of 3:1 to 1:1.

5. A method as set forth in claim 4 in which 14 SSC's and 7 stainless steel cables or wires are employed.

6. A method as set forth in claim 4 in which the void fraction of the SSC's is in the range of about 30 to 35% and the stainless steel cables or wires are of higher density.

7. A structure comprising a forced flow type superconducting cable-in-conduit prepared by steps comprising:
   (a) providing multifilamentary superconducting subcables (SSC's);
   (b) cabling around a first tube, SSC's from step (a) alternating with stainless steel cable or wire;
   (c) forming a second tube around the composite formed from step (b); and
   (d) flattening the double tube composite from step (c) to form a cable in-conduit.

8. A structure comprising a forced flow superconducting cable-in-conduit substantially having the configuration of a parallelepiped, comprising a flat metal support substantially in the center of said structure and extending longitudinally therein, cabled around said support an array of multifilamentary superconducting subclass (SSC's) alternated with stainless steel cables or wires, and a metal jacket around the assembly to form said structure; said structure having interior passages for the flow of a cooling fluid comprising void spaces both around and within the SSC's.

9. A structure as set forth in claim 8 substantially having the configuration of a rectangular parallelepiped.

10. A structure as set forth in claim 9 in which the SSC's have a void fraction in the range of about 30–35% and the stainless steel cables or wires are of higher density.

11. A structure as set forth in claim 9 in which the ratio of SSC's to stainless steel cables or wires is within the range of 3:1 to 1:1.

12. A structure as set forth in claim 9 in which the flat metal support and the metal jacket are made of a precipitation-hardened steel or a nickel-cobalt alloy.

13. A structure comprising a forced flow type superconducting cable-in-conduit substantially in the form of a rectangular parallelepiped, having a longitudinal plane and a plane substantially perpendicular thereto, and comprising a flattened tube support extending along the longitudinal plane and substantially midway of the perpendicular plane, cabled around said support an array of multifilamentary SSC's alternated with stainless steel cables or wires, and a jacket around the assembly; said SSC's having interior passages amounting to a void volume in the range of about 30–35% for the flow of a cooling fluid.

14. A structure comprising a forced flow type superconducting cable-in-conduit which comprises a housing in the form of a flat-sided figure having an essentially rectangular cross-section, within said housing a flattened tube support extending longitudinally and substantially centrally thereof, cabled around said support an array of multifilamentary SSC's alternated with stainless steel cables or wires, said SSC's having interior passages amounting to a void volume in the range of 30-35% for the flow of liquid helium.

15. A structure as set forth in claim 8 in which additionally a channel is provided in which the cable-in-conduit is placed.

* * * * *